(12) United States Patent
Tsai et al.

(10) Patent No.: US 11,874,185 B2
(45) Date of Patent: Jan. 16, 2024

(54) FORCE ATTENUATOR FOR FORCE SENSOR (71) Applicant: NEXTINPUT, INC., Mountain View, CA (US)

(72) Inventors: Julius Minglin Tsai, San Jose, CA (US); Dan Benjamin, Atlanta, GA (US)

(73) Assignee: NextInput, Inc., Mountain View, CA (US)

( * ) Notice: Subject to any disclaimer, the term of this patent is extended or adjusted under 35 U.S.C. 154(b) by 0 days.

(21) Appl. No.: 16/764,992

(22) PCT Filed: Nov. 16, 2018

(86) PCT No.: PCT/US2018/061509
§ 371 (c)(1),
(2) Date: May 18, 2020

(87) PCT Pub. No.: WO2019/099821
PCT Pub. Date: May 23, 2019

(65) Prior Publication Data
US 2020/0309615 A1 Oct. 1, 2020

Related U.S. Application Data (60) Provisional application No. 62/587,088, filed on Nov. 16, 2017.

(51) Int. Cl.
*G01L 1/18* (2006.01)
*G01L 1/16* (2006.01)
*G01L 1/26* (2006.01)

(52) U.S. Cl.
CPC ............. *G01L 1/18* (2013.01); *G01L 1/16* (2013.01); *G01L 1/26* (2013.01)

(58) Field of Classification Search
CPC ..... G01L 1/26; G01L 1/18; G01L 1/16; G01L 1/2275; G01L 5/162; G01L 19/0618
See application file for complete search history.

(56) References Cited

U.S. PATENT DOCUMENTS 4,276,533 A * 6/1981 Tominaga ............. G01L 19/147
338/42
4,594,639 A 6/1986 Kuisma
(Continued)

FOREIGN PATENT DOCUMENTS

| CN | 101341459 A | 1/2009 |
| CN | 101458134 A | 6/2009 |

(Continued)

OTHER PUBLICATIONS

PCT/US2018/061509, International Search Report and Written Opinion of the International Searching Authority, dated Jan. 29, 2019.

(Continued)

*Primary Examiner* — Tran M. Tran
(74) *Attorney, Agent, or Firm* — Withrow & Terranova, P.L.L.C.

(57) ABSTRACT

Described herein is a force attenuator for a force sensor. The force attenuator can linearly attenuate the force applied on the force sensor and therefore significantly extend the maximum sensing range of the force sensor. The area ratio of the force attenuator to the force sensor determines the maximum load available in a linear fashion.

14 Claims, 5 Drawing Sheets

(56) References Cited

U.S. PATENT DOCUMENTS

| | | | |
|---|---|---|---|
| 4,658,651 A | 4/1987 | Le | |
| 4,814,856 A | 3/1989 | Kurtz et al. | |
| 4,842,685 A * | 6/1989 | Adams | G01L 19/0084 |
| | | | 264/254 |
| 4,849,730 A | 7/1989 | Izumi et al. | |
| 4,914,624 A | 4/1990 | Dunthorn | |
| 4,918,262 A | 4/1990 | Flowers et al. | |
| 4,933,660 A | 6/1990 | Wynne, Jr. | |
| 4,983,786 A | 1/1991 | Stevens et al. | |
| 5,095,401 A | 3/1992 | Zavracky et al. | |
| 5,159,159 A | 10/1992 | Asher | |
| 5,166,612 A | 11/1992 | Murdock | |
| 5,237,879 A | 8/1993 | Speeter | |
| 5,291,795 A * | 3/1994 | Hafner | G01L 1/2231 |
| | | | 73/862.041 |
| 5,320,705 A | 6/1994 | Fujii et al. | |
| 5,333,505 A | 8/1994 | Takahashi et al. | |
| 5,343,220 A | 8/1994 | Veasy et al. | |
| 5,349,746 A | 9/1994 | Gruenwald et al. | |
| 5,351,550 A | 10/1994 | Maurer | |
| 5,483,994 A | 1/1996 | Maurer | |
| 5,510,812 A | 4/1996 | O'Mara et al. | |
| 5,541,372 A | 7/1996 | Baller et al. | |
| 5,543,591 A | 8/1996 | Gillespie et al. | |
| 5,565,657 A | 10/1996 | Merz | |
| 5,600,074 A | 2/1997 | Marek et al. | |
| 5,661,245 A * | 8/1997 | Svoboda | A61M 5/16854 |
| | | | 73/726 |
| 5,673,066 A | 9/1997 | Toda et al. | |
| 5,679,882 A * | 10/1997 | Gerlach | G01G 23/01 |
| | | | 177/1 |
| 5,760,313 A * | 6/1998 | Guentner | G01L 1/18 |
| | | | 73/862.584 |
| 5,773,728 A | 6/1998 | Tsukada et al. | |
| 5,780,727 A | 7/1998 | Gimzewski et al. | |
| 5,889,236 A | 3/1999 | Gillespie et al. | |
| 5,921,896 A | 7/1999 | Boland | |
| 5,969,591 A | 10/1999 | Fung | |
| 5,994,161 A | 11/1999 | Bitko et al. | |
| 6,012,336 A | 1/2000 | Eaton et al. | |
| 6,028,271 A | 2/2000 | Gillespie et al. | |
| 6,128,961 A | 10/2000 | Haronian | |
| 6,159,166 A | 12/2000 | Chesney et al. | |
| 6,243,075 B1 | 6/2001 | Fishkin et al. | |
| 6,348,663 B1 | 2/2002 | Schoos et al. | |
| 6,351,205 B1 | 2/2002 | Armstrong | |
| 6,360,598 B1 | 3/2002 | Calame et al. | |
| 6,437,682 B1 | 8/2002 | Vance | |
| 6,555,235 B1 | 4/2003 | Aufderheide et al. | |
| 6,556,189 B1 | 4/2003 | Takahata et al. | |
| 6,569,108 B2 | 5/2003 | Sarvazyan et al. | |
| 6,610,936 B2 | 8/2003 | Gillespie et al. | |
| 6,620,115 B2 | 9/2003 | Sarvazyan et al. | |
| 6,629,343 B1 | 10/2003 | Chesney et al. | |
| 6,668,230 B2 | 12/2003 | Mansky et al. | |
| 6,720,712 B2 | 4/2004 | Scott et al. | |
| 6,788,297 B2 | 9/2004 | Itoh et al. | |
| 6,801,191 B2 | 10/2004 | Mukai et al. | |
| 6,809,280 B2 | 10/2004 | Divigalpitiya et al. | |
| 6,812,621 B2 | 11/2004 | Scott | |
| 6,822,640 B2 | 11/2004 | Derocher | |
| 6,868,731 B1 | 3/2005 | Gatesman | |
| 6,879,318 B1 | 4/2005 | Chan et al. | |
| 6,888,537 B2 | 5/2005 | Benson et al. | |
| 6,915,702 B2 | 7/2005 | Omura et al. | |
| 6,931,938 B2 | 8/2005 | Knirck et al. | |
| 6,946,742 B2 * | 9/2005 | Karpman | B81B 7/0048 |
| | | | 257/707 |
| 6,995,752 B2 | 2/2006 | Lu | |
| 7,138,984 B1 | 11/2006 | Miles | |
| 7,173,607 B2 | 2/2007 | Matsumoto et al. | |
| 7,190,350 B2 | 3/2007 | Roberts | |
| 7,215,329 B2 | 5/2007 | Yoshikawa et al. | |
| 7,218,313 B2 | 5/2007 | Marcus et al. | |
| 7,224,257 B2 | 5/2007 | Morikawa | |
| 7,245,293 B2 | 7/2007 | Hoshino et al. | |
| 7,273,979 B2 | 9/2007 | Christensen | |
| 7,280,097 B2 | 10/2007 | Chen et al. | |
| 7,318,349 B2 | 1/2008 | Vaganov et al. | |
| 7,324,094 B2 | 1/2008 | Moilanen et al. | |
| 7,324,095 B2 | 1/2008 | Sharma | |
| 7,336,260 B2 | 2/2008 | Martin et al. | |
| 7,337,085 B2 | 2/2008 | Soss | |
| 7,343,223 B2 * | 3/2008 | Miura | B25J 13/085 |
| | | | 318/568.12 |
| 7,345,680 B2 | 3/2008 | David | |
| 7,367,232 B2 | 5/2008 | Vaganov et al. | |
| 7,406,661 B2 | 7/2008 | Vaananen et al. | |
| 7,425,749 B2 | 9/2008 | Hartzell et al. | |
| 7,426,873 B1 | 9/2008 | Kholwadwala et al. | |
| 7,449,758 B2 | 11/2008 | Axelrod et al. | |
| 7,460,109 B2 | 12/2008 | Safai et al. | |
| 7,476,952 B2 | 1/2009 | Vaganov et al. | |
| 7,508,040 B2 | 3/2009 | Nikkel et al. | |
| 7,554,167 B2 * | 6/2009 | Vaganov | G06F 3/0338 |
| | | | 257/415 |
| 7,571,647 B2 * | 8/2009 | Takemasa | G01P 1/006 |
| | | | 73/493 |
| 7,607,111 B2 | 10/2009 | Vaananen et al. | |
| 7,620,521 B2 | 11/2009 | Breed et al. | |
| 7,629,969 B2 | 12/2009 | Kent | |
| 7,637,174 B2 * | 12/2009 | Hirabayashi | G01L 5/162 |
| | | | 73/862.041 |
| 7,649,522 B2 | 1/2010 | Chen et al. | |
| 7,663,612 B2 | 2/2010 | Bladt | |
| 7,685,538 B2 | 3/2010 | Fleck et al. | |
| 7,698,084 B2 | 4/2010 | Soss | |
| 7,701,445 B2 | 4/2010 | Inokawa et al. | |
| 7,746,327 B2 | 6/2010 | Miyakoshi | |
| 7,772,657 B2 * | 8/2010 | Vaganov | G01L 1/044 |
| | | | 257/415 |
| 7,791,151 B2 | 9/2010 | Vaganov et al. | |
| 7,819,998 B2 | 10/2010 | David | |
| 7,825,911 B2 | 11/2010 | Sano et al. | |
| 7,829,960 B2 | 11/2010 | Takizawa | |
| 7,832,284 B2 * | 11/2010 | Hayakawa | G01L 1/20 |
| | | | 73/862.046 |
| 7,880,247 B2 * | 2/2011 | Vaganov | G06F 3/0338 |
| | | | 257/730 |
| 7,903,090 B2 | 3/2011 | Soss et al. | |
| 7,921,725 B2 | 4/2011 | Silverbrook et al. | |
| 7,938,028 B2 * | 5/2011 | Hirabayashi | G01L 1/26 |
| | | | 73/862.621 |
| 7,952,566 B2 | 5/2011 | Poupyrev et al. | |
| 7,973,772 B2 | 7/2011 | Gettemy et al. | |
| 7,973,778 B2 | 7/2011 | Chen | |
| 8,004,052 B2 | 8/2011 | Vaganov | |
| 8,004,501 B2 | 8/2011 | Harrison | |
| 8,013,843 B2 | 9/2011 | Pryor | |
| 8,026,906 B2 | 9/2011 | Molne et al. | |
| 8,044,929 B2 | 10/2011 | Baldo et al. | |
| 8,051,705 B2 * | 11/2011 | Kobayakawa | G01M 17/02 |
| | | | 73/146 |
| 8,068,100 B2 | 11/2011 | Pryor | |
| 8,072,437 B2 | 12/2011 | Miller et al. | |
| 8,072,440 B2 | 12/2011 | Pryor | |
| 8,096,188 B2 | 1/2012 | Wilner | |
| 8,113,065 B2 | 2/2012 | Ohsato et al. | |
| 8,120,586 B2 | 2/2012 | Hsu et al. | |
| 8,120,588 B2 | 2/2012 | Klinghult | |
| 8,130,207 B2 | 3/2012 | Nurmi et al. | |
| 8,134,535 B2 | 3/2012 | Choi et al. | |
| 8,139,038 B2 | 3/2012 | Chueh et al. | |
| 8,144,133 B2 | 3/2012 | Wang et al. | |
| 8,149,211 B2 | 4/2012 | Hayakawa et al. | |
| 8,154,528 B2 | 4/2012 | Chen et al. | |
| 8,159,473 B2 | 4/2012 | Cheng et al. | |
| 8,164,573 B2 | 4/2012 | DaCosta et al. | |
| 8,183,077 B2 | 5/2012 | Vaganov et al. | |
| 8,184,093 B2 | 5/2012 | Tsuiki | |
| 8,188,985 B2 | 5/2012 | Hillis et al. | |

(56) References Cited

U.S. PATENT DOCUMENTS

| | | | |
|---|---|---|---|
| 8,196,477 B2 * | 6/2012 | Ohsato | G01L 1/18 73/766 |
| 8,199,116 B2 | 6/2012 | Jeon et al. | |
| 8,212,790 B2 | 7/2012 | Rimas Ribikauskas et al. | |
| 8,220,330 B2 | 7/2012 | Miller et al. | |
| 8,237,537 B2 | 8/2012 | Kurtz | |
| 8,243,035 B2 | 8/2012 | Abe et al. | |
| 8,250,921 B2 | 8/2012 | Nasiri et al. | |
| 8,253,699 B2 | 8/2012 | Son | |
| 8,260,337 B2 | 9/2012 | Periyalwar et al. | |
| 8,269,731 B2 | 9/2012 | Molne | |
| 8,289,288 B2 | 10/2012 | Whytock et al. | |
| 8,289,290 B2 | 10/2012 | Klinghult | |
| 8,297,127 B2 | 10/2012 | Wade et al. | |
| 8,316,533 B2 * | 11/2012 | Suminto | B81C 1/00158 29/830 |
| 8,319,739 B2 | 11/2012 | Chu et al. | |
| 8,325,143 B2 | 12/2012 | Destura et al. | |
| 8,350,345 B2 | 1/2013 | Vaganov | |
| 8,363,020 B2 | 1/2013 | Li et al. | |
| 8,363,022 B2 | 1/2013 | Tho et al. | |
| 8,378,798 B2 | 2/2013 | Bells et al. | |
| 8,378,991 B2 | 2/2013 | Jeon et al. | |
| 8,384,677 B2 | 2/2013 | Mak-Fan et al. | |
| 8,387,464 B2 | 3/2013 | McNeil et al. | |
| 8,405,631 B2 | 3/2013 | Chu et al. | |
| 8,405,632 B2 | 3/2013 | Chu et al. | |
| 8,421,609 B2 | 4/2013 | Kim et al. | |
| 8,427,441 B2 | 4/2013 | Paleczny et al. | |
| 8,436,806 B2 | 5/2013 | Almalki et al. | |
| 8,436,827 B1 | 5/2013 | Zhai et al. | |
| 8,448,531 B2 * | 5/2013 | Schneider | G01L 1/26 73/862.641 |
| 8,451,245 B2 | 5/2013 | Heubel et al. | |
| 8,456,440 B2 | 6/2013 | Abe et al. | |
| 8,466,889 B2 | 6/2013 | Tong et al. | |
| 8,477,115 B2 | 7/2013 | Rekimoto | |
| 8,482,372 B2 | 7/2013 | Kurtz et al. | |
| 8,493,189 B2 | 7/2013 | Suzuki | |
| 8,497,757 B2 | 7/2013 | Kurtz et al. | |
| 8,516,906 B2 | 8/2013 | Umetsu et al. | |
| 8,646,335 B2 | 2/2014 | Kotovsky | |
| 8,833,172 B2 | 9/2014 | Chiou | |
| 8,931,347 B2 | 1/2015 | Donzier et al. | |
| 8,973,446 B2 | 3/2015 | Fukuzawa et al. | |
| 8,984,951 B2 | 3/2015 | Landmann et al. | |
| 8,991,265 B2 * | 3/2015 | Dekker | G01L 19/148 73/862.045 |
| 9,032,818 B2 * | 5/2015 | Campbell | G01L 1/18 73/862.628 |
| 9,097,600 B2 | 8/2015 | Khandani | |
| 9,143,057 B1 * | 9/2015 | Shah | B81C 1/00134 |
| 9,366,588 B2 * | 6/2016 | Lee | G01G 19/414 |
| 9,377,372 B2 * | 6/2016 | Ogawa | G01L 1/26 |
| 9,425,328 B2 | 8/2016 | Marx et al. | |
| 9,446,944 B2 * | 9/2016 | Ernst | G01L 19/0069 |
| 9,464,952 B2 * | 10/2016 | Pagani | G01L 1/18 |
| 9,487,388 B2 * | 11/2016 | Brosh | B81B 3/0072 |
| 9,493,342 B2 | 11/2016 | Brosh | |
| 9,574,954 B2 * | 2/2017 | Baker | G01L 9/02 |
| 9,709,509 B1 | 7/2017 | Yang | |
| 9,728,652 B2 * | 8/2017 | Elian | G01L 1/20 |
| 9,772,245 B2 | 9/2017 | Besling et al. | |
| 9,778,117 B2 * | 10/2017 | Pagani | G01L 1/148 |
| 9,791,303 B2 * | 10/2017 | Pagani | G01M 5/00 |
| 9,823,144 B2 * | 11/2017 | Fujisawa | G01L 1/26 |
| 9,835,515 B2 * | 12/2017 | Pagani | G01L 25/00 |
| 9,846,091 B2 * | 12/2017 | Lu | G01L 1/16 |
| 9,851,266 B2 * | 12/2017 | Nakamura | G01L 1/16 |
| 9,902,611 B2 | 2/2018 | Brosh et al. | |
| 9,967,679 B2 | 5/2018 | Krumbein et al. | |
| 9,970,831 B2 * | 5/2018 | Shih | G01L 1/16 |
| 9,983,084 B2 * | 5/2018 | Pavone | G01L 19/14 |
| 10,024,738 B2 * | 7/2018 | Conti | G01L 1/142 |
| 10,067,014 B1 * | 9/2018 | Tung | G01L 1/26 |
| 10,113,925 B2 * | 10/2018 | Lai | G01L 1/14 |
| 10,488,284 B2 * | 11/2019 | Jentoft | G01L 1/02 |
| 10,496,209 B2 * | 12/2019 | Vummidi Murali | G01L 25/00 |
| 10,595,748 B2 * | 3/2020 | Kubiak | A61B 5/746 |
| 10,598,578 B2 * | 3/2020 | Pagani | G01N 3/08 |
| 10,724,909 B2 * | 7/2020 | Abbasi Gavarti | G01L 1/18 |
| 10,788,389 B2 * | 9/2020 | Pagani | G01L 1/2206 |
| 10,962,427 B2 | 3/2021 | Youssefi et al. | |
| 11,385,108 B2 | 7/2022 | Tsai et al. | |
| 11,579,028 B2 * | 2/2023 | Tsai | G01L 1/16 |
| 2001/0009112 A1 | 7/2001 | Delaye | |
| 2003/0067448 A1 | 4/2003 | Park | |
| 2003/0128181 A1 | 7/2003 | Poole | |
| 2003/0189552 A1 | 10/2003 | Chuang et al. | |
| 2004/0012572 A1 | 1/2004 | Sowden et al. | |
| 2004/0140966 A1 | 7/2004 | Marggraff et al. | |
| 2005/0083310 A1 | 4/2005 | Safai et al. | |
| 2005/0166687 A1 * | 8/2005 | Kaneko | G01G 23/005 73/862.581 |
| 2005/0190152 A1 | 9/2005 | Vaganov | |
| 2005/0252301 A1 * | 11/2005 | Dietrich | G01L 19/14 73/717 |
| 2006/0028441 A1 | 2/2006 | Armstrong | |
| 2006/0244733 A1 | 11/2006 | Geaghan | |
| 2006/0272413 A1 | 12/2006 | Vaganov et al. | |
| 2006/0284856 A1 | 12/2006 | Soss | |
| 2007/0035525 A1 | 2/2007 | Yeh et al. | |
| 2007/0046649 A1 | 3/2007 | Reiner | |
| 2007/0070046 A1 | 3/2007 | Sheynblat et al. | |
| 2007/0070053 A1 | 3/2007 | Lapstun et al. | |
| 2007/0097095 A1 | 5/2007 | Kim et al. | |
| 2007/0103449 A1 | 5/2007 | Laitinen et al. | |
| 2007/0103452 A1 | 5/2007 | Wakai et al. | |
| 2007/0115265 A1 | 5/2007 | Rainisto | |
| 2007/0132717 A1 | 6/2007 | Wang et al. | |
| 2007/0137901 A1 | 6/2007 | Chen | |
| 2007/0139391 A1 | 6/2007 | Bischoff | |
| 2007/0152959 A1 | 7/2007 | Peters | |
| 2007/0156723 A1 | 7/2007 | Vaananen | |
| 2007/0182864 A1 | 8/2007 | Stoneham et al. | |
| 2007/0229478 A1 | 10/2007 | Rosenberg et al. | |
| 2007/0235231 A1 | 10/2007 | Loomis et al. | |
| 2007/0245836 A1 | 10/2007 | Vaganov | |
| 2007/0262965 A1 | 11/2007 | Hirai et al. | |
| 2007/0277616 A1 | 12/2007 | Nikkel et al. | |
| 2007/0298883 A1 | 12/2007 | Feldman et al. | |
| 2008/0001923 A1 | 1/2008 | Hall et al. | |
| 2008/0007532 A1 | 1/2008 | Chen | |
| 2008/0010616 A1 | 1/2008 | Algreatly | |
| 2008/0024454 A1 | 1/2008 | Everest | |
| 2008/0030482 A1 | 2/2008 | Elwell et al. | |
| 2008/0036743 A1 | 2/2008 | Westerman et al. | |
| 2008/0083962 A1 | 4/2008 | Vaganov | |
| 2008/0088600 A1 | 4/2008 | Prest et al. | |
| 2008/0088602 A1 | 4/2008 | Hotelling | |
| 2008/0094367 A1 | 4/2008 | Van De Ven et al. | |
| 2008/0105057 A1 | 5/2008 | Wade | |
| 2008/0105470 A1 | 5/2008 | Van De Ven et al. | |
| 2008/0106523 A1 | 5/2008 | Conrad | |
| 2008/0174852 A1 | 7/2008 | Hirai et al. | |
| 2008/0180402 A1 | 7/2008 | Yoo et al. | |
| 2008/0180405 A1 | 7/2008 | Han et al. | |
| 2008/0180406 A1 | 7/2008 | Han et al. | |
| 2008/0202249 A1 | 8/2008 | Yokura et al. | |
| 2008/0204427 A1 | 8/2008 | Heesemans et al. | |
| 2008/0211766 A1 | 9/2008 | Westerman et al. | |
| 2008/0238446 A1 | 10/2008 | DeNatale et al. | |
| 2008/0238884 A1 | 10/2008 | Harish | |
| 2008/0259046 A1 | 10/2008 | Carsanaro | |
| 2008/0284742 A1 | 11/2008 | Prest et al. | |
| 2008/0303799 A1 | 12/2008 | Schwesig et al. | |
| 2009/0027352 A1 | 1/2009 | Abele | |
| 2009/0027353 A1 | 1/2009 | Im et al. | |
| 2009/0046110 A1 | 2/2009 | Sadler et al. | |
| 2009/0078040 A1 | 3/2009 | Ike et al. | |
| 2009/0102805 A1 | 4/2009 | Meijer et al. | |
| 2009/0140985 A1 | 6/2009 | Liu | |
| 2009/0184921 A1 | 7/2009 | Scott et al. | |

(56) References Cited

U.S. PATENT DOCUMENTS

| | | |
|---|---|---|
| 2009/0184936 A1 | 7/2009 | Algreatly |
| 2009/0213066 A1 | 8/2009 | Hardacker et al. |
| 2009/0237275 A1 | 9/2009 | Vaganov |
| 2009/0237374 A1 | 9/2009 | Li et al. |
| 2009/0242282 A1 | 10/2009 | Kim et al. |
| 2009/0243817 A1 | 10/2009 | Son |
| 2009/0243998 A1 | 10/2009 | Wang |
| 2009/0256807 A1 | 10/2009 | Nurmi |
| 2009/0256817 A1 | 10/2009 | Perlin et al. |
| 2009/0282930 A1 | 11/2009 | Cheng et al. |
| 2009/0303400 A1 | 12/2009 | Hou et al. |
| 2009/0309852 A1 | 12/2009 | Lin et al. |
| 2009/0314551 A1 | 12/2009 | Nakajima |
| 2010/0013785 A1 | 1/2010 | Murai et al. |
| 2010/0020030 A1 | 1/2010 | Kim et al. |
| 2010/0020039 A1 | 1/2010 | Ricks et al. |
| 2010/0039396 A1 | 2/2010 | Ho et al. |
| 2010/0053087 A1 | 3/2010 | Dai et al. |
| 2010/0053116 A1 | 3/2010 | Daverman et al. |
| 2010/0066686 A1 | 3/2010 | Joguet et al. |
| 2010/0066697 A1 | 3/2010 | Jacomet et al. |
| 2010/0079391 A1 | 4/2010 | Joung |
| 2010/0079395 A1 | 4/2010 | Kim et al. |
| 2010/0079398 A1 | 4/2010 | Shen et al. |
| 2010/0097347 A1 | 4/2010 | Lin |
| 2010/0102403 A1 | 4/2010 | Celik-Butler et al. |
| 2010/0117978 A1 | 5/2010 | Shirado |
| 2010/0123671 A1 | 5/2010 | Lee |
| 2010/0123686 A1 | 5/2010 | Klinghult et al. |
| 2010/0127140 A1 | 5/2010 | Smith |
| 2010/0128002 A1 | 5/2010 | Stacy et al. |
| 2010/0153891 A1 | 6/2010 | Vaananen et al. |
| 2010/0164959 A1 | 7/2010 | Brown et al. |
| 2010/0220065 A1 | 9/2010 | Ma |
| 2010/0224004 A1 | 9/2010 | Suminto et al. |
| 2010/0271325 A1 | 10/2010 | Conte et al. |
| 2010/0289807 A1 | 11/2010 | Yu et al. |
| 2010/0295807 A1 | 11/2010 | Xie et al. |
| 2010/0308844 A1 | 12/2010 | Day et al. |
| 2010/0309714 A1 | 12/2010 | Meade |
| 2010/0315373 A1 | 12/2010 | Steinhauser et al. |
| 2010/0321310 A1 | 12/2010 | Kim et al. |
| 2010/0321319 A1 | 12/2010 | Hefti |
| 2010/0323467 A1* | 12/2010 | Vaganov .......... G01L 1/18 257/E21.002 |
| 2010/0328229 A1 | 12/2010 | Weber et al. |
| 2010/0328230 A1 | 12/2010 | Faubert et al. |
| 2011/0001723 A1 | 1/2011 | Fan |
| 2011/0006980 A1 | 1/2011 | Taniguchi et al. |
| 2011/0007008 A1 | 1/2011 | Algreatly |
| 2011/0012848 A1 | 1/2011 | Li et al. |
| 2011/0018820 A1 | 1/2011 | Huitema et al. |
| 2011/0032211 A1 | 2/2011 | Christofferson |
| 2011/0039602 A1 | 2/2011 | McNamara et al. |
| 2011/0050628 A1 | 3/2011 | Homma et al. |
| 2011/0050630 A1 | 3/2011 | Ikeda |
| 2011/0057899 A1 | 3/2011 | Sleeman et al. |
| 2011/0063248 A1 | 3/2011 | Yoon |
| 2011/0113881 A1 | 5/2011 | Suzuki |
| 2011/0128250 A1 | 6/2011 | Murphy et al. |
| 2011/0141052 A1 | 6/2011 | Bernstein et al. |
| 2011/0141053 A1 | 6/2011 | Bulea et al. |
| 2011/0187674 A1 | 8/2011 | Baker et al. |
| 2011/0209555 A1 | 9/2011 | Ahles et al. |
| 2011/0227836 A1 | 9/2011 | Li et al. |
| 2011/0242014 A1 | 10/2011 | Tsai et al. |
| 2011/0267181 A1 | 11/2011 | Kildal |
| 2011/0267294 A1 | 11/2011 | Kildal |
| 2011/0273396 A1 | 11/2011 | Chung |
| 2011/0291951 A1 | 12/2011 | Tong |
| 2011/0298705 A1 | 12/2011 | Vaganov |
| 2011/0308324 A1 | 12/2011 | Gamage et al. |
| 2012/0025337 A1 | 2/2012 | Leclair et al. |
| 2012/0032907 A1 | 2/2012 | Koizumi et al. |
| 2012/0032915 A1 | 2/2012 | Wittorf |
| 2012/0038579 A1 | 2/2012 | Sasaki |
| 2012/0044169 A1 | 2/2012 | Enami |
| 2012/0044172 A1 | 2/2012 | Ohki et al. |
| 2012/0050159 A1 | 3/2012 | Yu et al. |
| 2012/0050208 A1 | 3/2012 | Dietz |
| 2012/0056837 A1 | 3/2012 | Park et al. |
| 2012/0060605 A1 | 3/2012 | Wu et al. |
| 2012/0061823 A1 | 3/2012 | Wu et al. |
| 2012/0062603 A1 | 3/2012 | Mizunuma et al. |
| 2012/0068946 A1 | 3/2012 | Tang et al. |
| 2012/0068969 A1 | 3/2012 | Bogana et al. |
| 2012/0081327 A1 | 4/2012 | Heubel et al. |
| 2012/0086659 A1 | 4/2012 | Perlin et al. |
| 2012/0092250 A1 | 4/2012 | Hadas et al. |
| 2012/0092279 A1 | 4/2012 | Martin |
| 2012/0092294 A1 | 4/2012 | Ganapathi et al. |
| 2012/0092299 A1 | 4/2012 | Harada et al. |
| 2012/0092324 A1 | 4/2012 | Buchan et al. |
| 2012/0105358 A1 | 5/2012 | Momeyer et al. |
| 2012/0105367 A1 | 5/2012 | Son et al. |
| 2012/0113061 A1 | 5/2012 | Ikeda |
| 2012/0127088 A1 | 5/2012 | Pance et al. |
| 2012/0127107 A1 | 5/2012 | Miyashita et al. |
| 2012/0139864 A1 | 6/2012 | Sleeman et al. |
| 2012/0144921 A1 | 6/2012 | Bradley et al. |
| 2012/0146945 A1 | 6/2012 | Miyazawa et al. |
| 2012/0146946 A1 | 6/2012 | Wang et al. |
| 2012/0147052 A1 | 6/2012 | Homma et al. |
| 2012/0154315 A1 | 6/2012 | Bradley et al. |
| 2012/0154316 A1 | 6/2012 | Kono |
| 2012/0154317 A1 | 6/2012 | Aono |
| 2012/0154318 A1 | 6/2012 | Aono |
| 2012/0154328 A1 | 6/2012 | Kono |
| 2012/0154329 A1 | 6/2012 | Shinozaki |
| 2012/0154330 A1 | 6/2012 | Shimizu |
| 2012/0162122 A1 | 6/2012 | Geaghan |
| 2012/0169609 A1 | 7/2012 | Britton |
| 2012/0169617 A1 | 7/2012 | Maenpaa |
| 2012/0169635 A1 | 7/2012 | Liu |
| 2012/0169636 A1 | 7/2012 | Liu |
| 2012/0180575 A1* | 7/2012 | Sakano .......... G01L 5/165 73/862.626 |
| 2012/0188181 A1 | 7/2012 | Ha et al. |
| 2012/0194460 A1 | 8/2012 | Kuwabara et al. |
| 2012/0194466 A1 | 8/2012 | Posamentier |
| 2012/0200526 A1 | 8/2012 | Lackey |
| 2012/0204653 A1 | 8/2012 | August et al. |
| 2012/0205165 A1 | 8/2012 | Strittmatter et al. |
| 2012/0218212 A1 | 8/2012 | Yu et al. |
| 2012/0234112 A1 | 9/2012 | Umetsu et al. |
| 2012/0256237 A1 | 10/2012 | Lakamraju et al. |
| 2012/0286379 A1 | 11/2012 | Inoue |
| 2012/0319987 A1 | 12/2012 | Woo |
| 2012/0327025 A1 | 12/2012 | Huska et al. |
| 2013/0008263 A1 | 1/2013 | Kabasawa et al. |
| 2013/0038541 A1 | 2/2013 | Bakker |
| 2013/0093685 A1 | 4/2013 | Kalu et al. |
| 2013/0096849 A1 | 4/2013 | Campbell et al. |
| 2013/0140944 A1 | 6/2013 | Chen et al. |
| 2013/0187201 A1 | 7/2013 | Elian et al. |
| 2013/0239700 A1 | 9/2013 | Benfield et al. |
| 2013/0255393 A1 | 10/2013 | Fukuzawa et al. |
| 2013/0283922 A1 | 10/2013 | Qualtieri et al. |
| 2013/0341741 A1 | 12/2013 | Brosh |
| 2013/0341742 A1 | 12/2013 | Brosh |
| 2014/0007705 A1 | 1/2014 | Campbell et al. |
| 2014/0028575 A1 | 1/2014 | Parivar et al. |
| 2014/0055407 A1 | 2/2014 | Lee et al. |
| 2014/0090488 A1 | 4/2014 | Taylor et al. |
| 2014/0109693 A1* | 4/2014 | Sakai .......... G01L 1/26 73/862.382 |
| 2014/0230563 A1 | 8/2014 | Huang |
| 2014/0260678 A1 | 9/2014 | Jentoft et al. |
| 2014/0283604 A1 | 9/2014 | Najafi et al. |
| 2014/0367811 A1 | 12/2014 | Nakagawa et al. |
| 2015/0110295 A1 | 4/2015 | Jenkner et al. |
| 2015/0226618 A1 | 8/2015 | Shih |
| 2015/0241465 A1 | 8/2015 | Konishi |

(56) References Cited

U.S. PATENT DOCUMENTS

| | | | |
|---|---|---|---|
| 2015/0362389 A1* | 12/2015 | Yanev | G01L 1/26 |
| | | | 73/862.041 |
| 2016/0069927 A1 | 3/2016 | Hamamura | |
| 2016/0103545 A1 | 4/2016 | Filiz et al. | |
| 2016/0223579 A1 | 8/2016 | Froemel et al. | |
| 2016/0245667 A1 | 8/2016 | Najafi et al. | |
| 2016/0332866 A1 | 11/2016 | Brosh et al. | |
| 2016/0354589 A1* | 12/2016 | Kobayashi | A61M 37/0015 |
| 2016/0363490 A1 | 12/2016 | Campbell et al. | |
| 2017/0103246 A1 | 4/2017 | Pi et al. | |
| 2017/0205303 A1 | 7/2017 | Sanden et al. | |
| 2017/0233245 A1* | 8/2017 | Duqi | B81B 7/0041 |
| | | | 257/419 |
| 2017/0234744 A1* | 8/2017 | Tung | G01L 1/26 |
| | | | 73/862.627 |
| 2018/0058914 A1* | 3/2018 | Iesato | G01L 1/22 |
| 2018/0058955 A1* | 3/2018 | Wade | B81C 1/00158 |
| 2019/0330053 A1* | 10/2019 | Tseng | B81B 7/0077 |
| 2019/0383675 A1 | 12/2019 | Tsai et al. | |
| 2019/0383676 A1* | 12/2019 | Foughi | B81C 1/00246 |
| 2020/0149983 A1 | 5/2020 | Tsai et al. | |
| 2020/0234023 A1 | 7/2020 | Tsai et al. | |
| 2020/0378845 A1 | 12/2020 | Bergemont et al. | |
| 2021/0190608 A1 | 6/2021 | Tsai et al. | |
| 2022/0228971 A1 | 7/2022 | Yoshikawa et al. | |

FOREIGN PATENT DOCUMENTS

| | | |
|---|---|---|
| CN | 101801837 A | 8/2010 |
| CN | 201653605 U | 11/2010 |
| CN | 101929898 A | 12/2010 |
| CN | 102062662 A | 5/2011 |
| CN | 102853950 A | 1/2013 |
| CN | 102998037 A | 3/2013 |
| CN | 103308239 A | 9/2013 |
| CN | 104535229 A | 4/2015 |
| CN | 104581605 A | 4/2015 |
| CN | 104919293 A | 9/2015 |
| CN | 105934661 A | 9/2016 |
| DE | 102010012441 A1 | 9/2011 |
| JP | 2004156937 A | 6/2004 |
| JP | 2010147268 A | 7/2010 |
| JP | 2012037528 B2 | 2/2012 |
| KR | 20200106745 A | 9/2020 |
| WO | 9310430 A1 | 5/1993 |
| WO | 2004113859 A1 | 12/2004 |
| WO | 2007139695 A2 | 12/2007 |
| WO | 2010046233 A1 | 4/2010 |
| WO | 2011065250 A1 | 6/2011 |
| WO | 2013067548 A1 | 5/2013 |
| WO | 2015039811 A1 | 3/2015 |
| WO | 2015106246 A1 | 7/2015 |
| WO | 2018148503 A1 | 8/2018 |
| WO | 2018148510 A1 | 8/2018 |
| WO | 2019023552 A1 | 1/2019 |
| WO | 2019079420 A1 | 4/2019 |
| WO | 2020237039 A1 | 11/2020 |

OTHER PUBLICATIONS

Mei, et al., "Design and Fabrication of an Integrated Three-Dimensional Tactile Sensor for Space Robotic Applications," International Conference on Micro Electro Mechanical Systems, Jan. 1999, Orlando, Florida, IEEE, pp. 112-117.

Nesterov, et al., "Modelling and investigation of the silicon twin design 3D micro probe," Journal of Micromechanics and Microengineering, vol. 15, 2005, IOP Publishing Ltd, pp. 514-520.

First Office Action for Chinese Patent Application No. 201880023913.1, dated Dec. 25, 2020, 22 pages.

Second Office Action for Chinese Patent Application No. 201880023913.1, dated Sep. 10, 2021, 13 pages.

Third Office Action for Chinese Patent Application No. 201880023913.1, dated Apr. 6, 2022, 13 pages.

Extended European Search Report for European Patent Application No. 18751209.0, dated Oct. 22, 2020, 7 pages.

International Search Report and Written Opinion for International Patent Application No. PCT/US2018/017564, dated Jun. 15, 2018, 10 pages.

Non-Final Office Action for U.S. Appl. No. 16/485,016, dated Jun. 12, 2020, 13 pages.

Final Office Action for U.S. Appl. No. 16/485,016, dated Mar. 24, 2021, 10 pages.

Notice of Allowance for U.S. Appl. No. 16/485,016, dated Jul. 9, 2021, 8 pages.

International Search Report and Written Opinion for International Patent Application No. PCT/US2018/017572, dated Mar. 2018, 8 pages.

Decision of Rejection for Chinese Patent Application No. 201880023913.1, dated Oct. 27, 2022, 9 pages.

Non-Final Office Action for U.S. Appl. No. 17/676,477, dated Nov. 23, 2022, 12 pages.

Notice of Allowance for U.S. Appl. No. 17/51,715, dated Oct. 26, 2022, 13 pages.

Notice of Allowance for U.S. Appl. No. 17/591,706, dated Nov. 10, 2022, 12 pages.

Notice of Allowance for U.S. Appl. No. 16/757,225, dated Oct. 6, 2022, 9 pages.

Examination Report for European Patent Application No. 18751209.0, dated Dec. 19, 2022, 5 pages.

Non-Final Office Action for U.S. Appl. No. 16/485,026, dated Apr. 28, 2021, 13 pages.

Applicant-Initiated Interview Summary for U.S. Appl. No. 16/485,026, dated Aug. 25, 2021, 2 pages.

Notice of Allowance for U.S. Appl. No. 16/485,026, dated Sep. 30, 2021, 8 pages.

Non-Final Office Action for U.S. Appl. No. 16/632,795, dated Feb. 18, 2021, 10 pages.

Notice of Allowance for U.S. Appl. No. 16/632,795, dated Sep. 3, 2021, 7 pages.

Non-Final Office Action for U.S. Appl. No. 16/634,469, dated May 27, 2021, 13 pages.

Notice of Allowance for U.S. Appl. No. 16/634,469, dated Sep. 30, 2021, 8 pages.

Non-Final Office Action for U.S. Appl. No. 16/757,225, dated Oct. 5, 2021, 14 pages.

Notice of Allowance for U.S. Appl. No. 16/757,225, dated May 10, 2022, 9 pages.

Virginia Semiconductors, "The General Properties of Si, Ge, SiGe2, SiO2, and Si3N4," Jun. 2002, www.virginiasemi.com/pdf/generalpropertiesSi62002.pdf, Virginia Semiconductor Inc., 5 pages.

International Search Report and Written Opinion for International Patent Application No. PCT/US2018/056245, dated Dec. 27, 2018, 8 pages.

International Search Report and Written Opinion for International Patent Application No. PCT/US2018/044049, dated Oct. 18, 2018, 11 pages.

Office Action for Chinese Patent Application No. 2018800601531, dated Apr. 6, 2021, 16 pages.

Communication Pursuant to Rule 164(1) EPC issued for European Application No. 18834426.1, dated Mar. 10, 2021, 16 pages.

Extended European Search Report issued for European Application No. 18834426.1, dated Jun. 10, 2021, 13 pages.

International Search Report and Written Opinion for International Patent Application No. PCT/US2018/042883, dated Dec. 6, 2018, 9 pages.

Non-Final Office Action for U.S. Appl. No. 17/676,477, dated May 9, 2023, 11 pages.

Notice of Allowance for U.S. Appl. No. 18/081,255, dated Apr. 27, 2023, 14 pages.

Non-Final Office Action for U.S. Appl. No. 18/103,465, dated May 24, 2023, 7 pages.

Non-Final Office Action for U.S. Appl. No. 18/117,156, dated Jul. 19, 2023, 13 pages.

Notice of Allowance for U.S. Appl. No. 18/103,465, dated Sep. 27, 2023, 8 pages.

(56) References Cited

OTHER PUBLICATIONS

Notice of Allowance for U.S. Appl. No. 17/676,477, dated Nov. 8, 2023, 8 pages.
Notice of Allowance for U.S. Appl. No. 18/117,156, dated Nov. 8, 2023, 8 pages.
Examination Report for European Patent Application No. 18834426.1, dated Sep. 6, 2023, 8 pages.

* cited by examiner

FORCE ATTENUATOR FOR FORCE SENSOR

CROSS-REFERENCE TO RELATED APPLICATIONS

This application is a national stage application filed under 35 U.S.C. § 371 of PCT/US2018/061509 filed Nov. 16, 2018, which claims the benefit of U.S. provisional patent application No. 62/587,088, filed on Nov. 16, 2017, and entitled "FORCE ATTENUATOR FOR FORCE SENSOR," the disclosures of which are expressly incorporated herein by reference in their entireties.

FIELD OF TECHNOLOGY

The present disclosure relates to a force attenuator for a force sensor that extends the maximum load of the force sensor.

BACKGROUND

Microelectromechanical systems (MEMS) force sensors are designed with certain maximum load in mind for certain applications. The maximum load of a MEMS force sensor is typically in the range of 10 kilograms (kg) or less. It is very difficult to increase the maximum load applied to a MEMS force sensor as MEMS force sensors typically have small form factor in the range of a couple square millimeters ($mm^2$) in area. With the known fractural strength of silicon, there is a fixed maximum load the sensor is capable of handling. It is intuitive to increase the size to accommodate the larger maximum load. However, this approach is not cost effective and not flexible to accommodate various demands of maximum load range. A better solution is required to fit one sensor for multiple applications.

SUMMARY

In one implementation, the present disclosure pertains to a force attenuator for a force sensor. The force attenuator can be made of rubber material. This attenuator serves as a force transformer in the reduction manner, for example, attenuating the applied force to facilitate a force sensor's ability to sense larger loads. The surface area ratio between the force attenuator and the force sensor linearly defines the "turn ratio" of this force transformer. Multiple implementations of such force attenuator to different types of force sensors and the simulation data to support the linear relationship are described below.

An example force attenuated force sensor is described herein. The force attenuated force sensor can include a force attenuator including a deformable slab having two opposing surfaces, where the force attenuator defines a surface area for receiving an applied force. The force attenuated force sensor can also include a cavity formed on one of the two opposing surfaces of the deformable slab, and a force sensor arranged in the cavity. The force sensor can define a surface area for receiving the applied force, and a ratio of the surface area of the force sensor to the surface area of the force attenuator can have a linear relationship with the sensitivity attenuation of the force sensor.

Additionally, the deformable slab and the force sensor can be configured for mounting on a solid surface.

Alternatively or additionally, the deformable slab can be made of rubbery material.

Alternatively or additionally, the force attenuator can further include a solid non-deformable slab disposed on the deformable slab. The solid non-deformable slab can be disposed on a surface of the deformable slab opposite to a mounting surface.

Alternatively or additionally, the force sensor can be a microelectromechanical system (MEMS) force sensor. In some implementations, the MEMS force sensor can be a chip scale packaged MEMS force sensor including a piezoresistive sensing element. In some implementations, the MEMS force sensor can be a chip scale packaged MEMS force sensor including a piezoelectric sensing element. In some implementations, the MEMS force sensor can be a chip scale packaged MEMS force sensor including both piezoresistive and piezoelectric sensing elements. Optionally, the chip scale packaged MEMS force sensor can include a sealed cavity.

Alternatively or additionally, the force attenuated force sensor can include a package substrate, where the chip scale packaged MEMS force sensor can be electrically and mechanically connected to the package substrate. The chip scale packaged MEMS force sensor and the package substrate can be arranged in the cavity.

Alternatively or additionally, the sensitivity attenuation of the force sensor increases as the area ratio increases, and the sensitivity attenuation of the force sensor decreases as the area ratio decreases.

Alternatively or additionally, the deformable slab can define a cylindrical shape.

Alternatively or additionally, the two opposing surfaces of the deformable slab can be parallel surfaces.

An example force attenuator is described herein. The force attenuator can include a deformable slab having two opposing surfaces, where the force attenuator defines a surface area for receiving an applied force. The force attenuator can also include a cavity formed on one of the two opposing surfaces of the deformable slab. The cavity can be configured to accommodate a force sensor. Additionally, a ratio of a surface area of the force sensor to the surface area of the force attenuator can have a linear relationship with the sensitivity attenuation of the force sensor.

Alternatively or additionally, the force sensor can be a microelectromechanical system (MEMS) force sensor.

Alternatively or additionally, the deformable slab can be made of rubbery material.

Alternatively or additionally, the force attenuator can further include a solid non-deformable slab disposed on the deformable slab. The solid non-deformable slab can be disposed on a surface of the deformable slab opposite to a mounting surface.

Alternatively or additionally, the two opposing surfaces of the deformable slab can be parallel surfaces.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE FIGURES

The components in the drawings are not necessarily to scale relative to each other. Like reference numerals designate corresponding parts throughout the several views. These and other features of will become more apparent in the detailed description in which reference is made to the appended drawings wherein.

DETAILED DESCRIPTION

The present disclosure can be understood more readily by reference to the following detailed description, examples, drawings, and their previous and following description. However, before the present devices, systems, and/or methods are disclosed and described, it is to be understood that this disclosure is not limited to the specific devices, systems, and/or methods disclosed unless otherwise specified, and, as such, can, of course, vary. It is also to be understood that the terminology used herein is for the purpose of describing particular aspects only and is not intended to be limiting.

The following description is provided as an enabling teaching. To this end, those skilled in the relevant art will recognize and appreciate that many changes can be made, while still obtaining beneficial results. It will also be apparent that some of the desired benefits can be obtained by selecting some of the features without utilizing other features. Accordingly, those who work in the art will recognize that many modifications and adaptations may be possible and can even be desirable in certain circumstances, and are contemplated by this disclosure. Thus, the following description is provided as illustrative of the principles and not in limitation thereof.

As used throughout, the singular forms "a," "an" and "the" include plural referents unless the context clearly dictates otherwise. Thus, for example, reference to "a sensing element" can include two or more such sensing elements unless the context indicates otherwise.

The term "comprising" and variations thereof as used herein is used synonymously with the term "including" and variations thereof and are open, non-limiting terms.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

The present disclosure relates to a force attenuator with a cavity designed to fit a force sensor inside the cavity. The force attenuators described herein can optionally be used when the load on a force sensor (e.g., MEMS force sensor) is expected to be equal to or greater than about 10 Newtons (N). For example, this disclosure contemplates that the force attenuators described herein can be used to allow the use of a force sensor (e.g., MEMS force sensor) in applications including, but not limited to, automotive applications (e.g., car seat/passenger weight sensing), medical applications (e.g., patient bed monitoring), or weight scales (e.g., body weight, vehicle weigh stations, etc.). The force attenuator acts as a force transformer and adapts the same force sensor for use in applications with different maximum load requirements. As described herein, the force attenuator can be used to increase the maximum load of a given force sensor. In other words, the force attenuator can significantly extend the maximum sensing range of a given force sensor.

Figure 1:
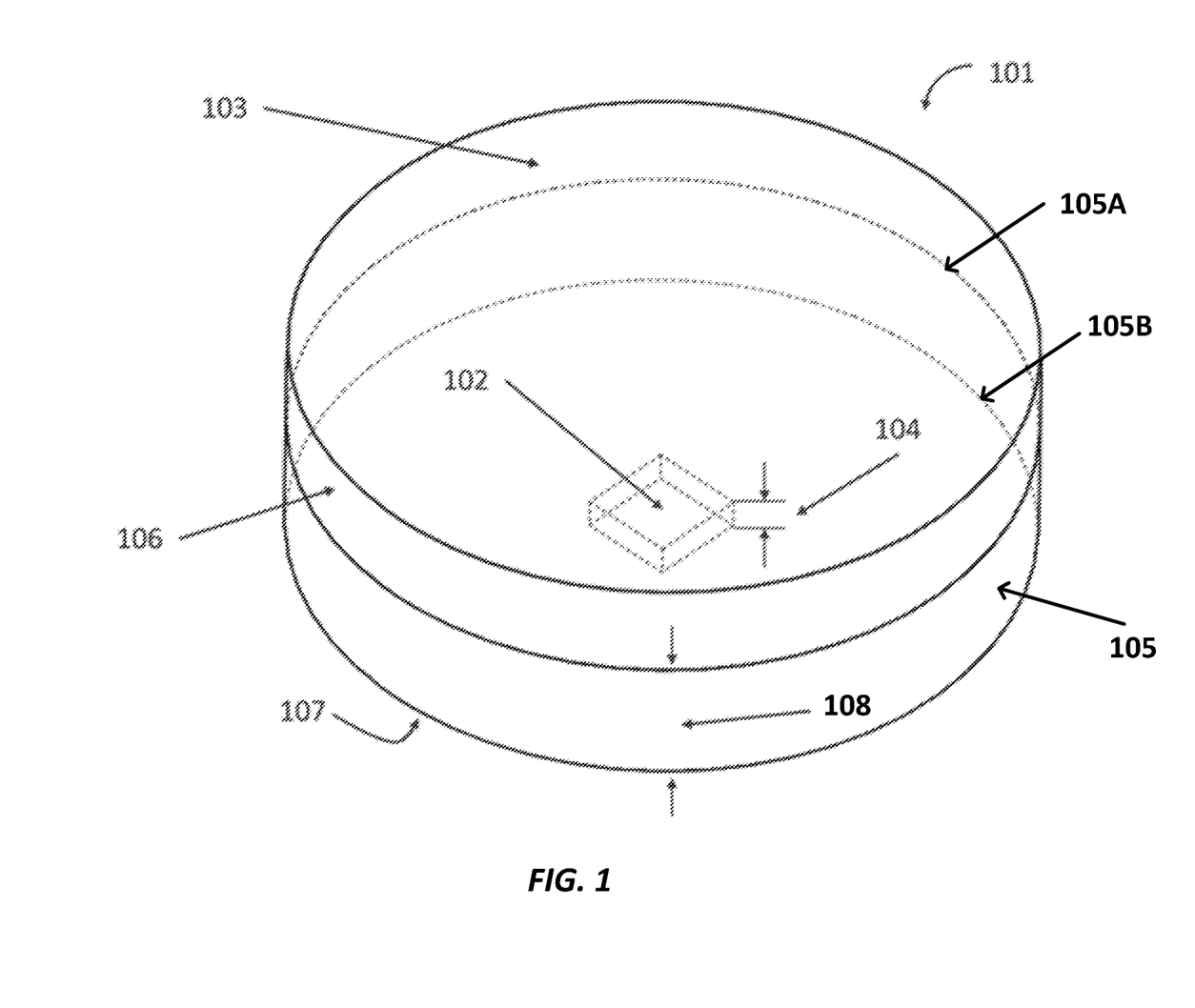
FIG. 1 illustrates a perspective view of an example force attenuator including a cavity that accommodates a force sensor.

Referring now to FIG. 1, a force attenuator 101 is shown. The force attenuator 101 includes a deformable slab 105 with a plurality (e.g. two) opposing surfaces 105A, 105B. In some implementations, surfaces 105A, 105b are parallel, which can help reduce preload on a force sensor. The deformable slab 105 has a cylindrical shape such that each of the opposing surfaces 105A, 105B has a circular cross section as shown in FIG. 1. It should be understood that the deformable slab having a cylindrical shape is provided only as an example. This disclosure contemplates that the deformable slab can have other shapes. In some implementations, the deformable slab 105 is formed of a rubber material. It should be understood that rubber material is provided only as an example. This disclosure contemplates that the deformable slab 105 can be made of other deformable materials including, but not limited to, elastomers, silicone rubber, polyurethane, acrylonitrile butadiene styrene (ABS), or a material with a Young's modulus less than about 2 gigapascals (GPa) that can tolerate a strain larger than about 10% without yielding. In FIG. 1, the force is applied to a top surface 103 of the force attenuator 101. Additionally, the force attenuator 101 can define a surface area for receiving an applied force, for example, the surface area of the top surface 103. In some implementations, surface 105A can serve as the top surface of the force attenuator 101 (not shown). In other implementations, a surface of a non-deformable slab, which is described in detail below, can serve as the top surface of the force attenuator 101 as shown in FIG. 1. It should be understood that the force sensor itself can define a surface area for receiving an applied force, which is transferred through the force attenuator 101.

The force attenuator 101 can include a cavity 102. The dimensions (e.g., size and/or shape) of the cavity 102 can be designed to accommodate a force sensor. In other words, the force sensor can be arranged or placed inside of the cavity 102. In some implementations, the force sensor can be fitted inside the cavity 102. In this way, the force that is applied to the force attenuator 101 is transferred to the force sensor. Optionally, the force sensor can be a MEMS force sensor as described herein. Example MEMS force sensors are described in U.S. Pat. No. 9,487,388, issued Nov. 8, 2016 and entitled "Ruggedized MEMS Force Die;" U.S. Pat. No. 9,493,342, issued Nov. 15, 2016 and entitled "Wafer Level MEMS Force Dies;" U.S. Pat. No. 9,902,611, issued Feb. 27, 2018 and entitled "Miniaturized and ruggedized wafer level mems force sensors;" U.S. Patent Application Publication No. 2016/0363490 to Campbell et al., filed Jun. 10, 2016 and entitled "Ruggedized wafer level mems force sensor with a tolerance trench;" WO2018/148503 to NextInput, Inc., filed Feb. 9, 2018 and entitled "INTEGRATED DIGITAL FORCE SENSORS AND RELATED METHODS OF MANUFACTURE;" and WO2018/148510 to NextInput, Inc., filed Feb. 9, 2018 and entitled "INTEGRATED PIEZORESISTIVE AND PIEZOELECTRIC FUSION FORCE SENSOR," the disclosures of which are incorporated by reference in their entireties. As shown in FIG. 1, the cavity 102 is formed on a bottom surface 107 of the force attenuator 101. For example, the cavity 102 is formed on surface 105B of the deformable slab 105. The force sensor can be fitted inside the cavity 102 such that it receives the force applied on the top surface 103 of the force attenuator 101. As described above, the force sensor can define a surface area, which is smaller than the surface area of the force attenuator 101. For example, the surface area of the surface of a MEMS force sensor that receives the applied force is typically on the order of $mm^2$. The surface area of the surface of the force attenuator (e.g., top surface 103 shown in FIG. 1) that receives the applied force can be orders of magnitude larger than that of the force sensor. As described below, the ratio of the force sensor's surface area to the force attenuator's surface area has a linear relationship to sensitivity attenuation (see FIG. 5). Additionally, a depth of the cavity (also referred to herein as "cavity depth"), which is shown by opposing arrows 104 in FIG. 1, is designed such that a height of the force sensor is equal to, or slightly larger than, the cavity depth 104. A thickness of the deformable slab 105, which is shown by opposing arrows 108 in FIG. 1, is designed such that there is still sufficient material (e.g., rubber) disposed over the force sensor at maximum load. For example, a typical force sensor has a height in the range of about 0.2 mm-0.6 mm. Accordingly, in some implementations, the cavity depth 104 can be equal to the height of the force sensor (e.g., about 0.2 mm-0.6 mm depending on the force sensor). Alternatively, in other implementations, the cavity depth 104 can be about 25 micrometers (μm)-50 μm less than the height of the force sensor, which ensures that the force attenuator 101 contacts the force sensor but without applying excessive preload to the force sensor.

Optionally, the force attenuator 101 can be in the shape of a stacked slab. For example, the force attenuator 101 can optionally further include a solid non-deformable slab 106 disposed on top of the deformable slab 105, e.g., forming the stacked slab as shown in FIG. 1. The solid non-deformable slab 106 can have a size and/or shape that matches the size and/or shape of the deformable slab 105 in cross section. For example, the solid non-deformable slab 106 shown in FIG. 1 has a cylindrical shape. It should be understood that the solid non-deformable slab having a cylindrical shape is provided only as an example. This disclosure contemplates that the solid non-deformable slab can have other shapes. This disclosure contemplates that the solid non-deformable slab 106 can be made of a non-deformable material. The solid non-deformable slab 106 can evenly distribute the force load applied on the top surface 103 of the force attenuator 101. The solid non-deformable slab 106 can be provided when there is a risk of damage to the force sensor.

Figure 2:
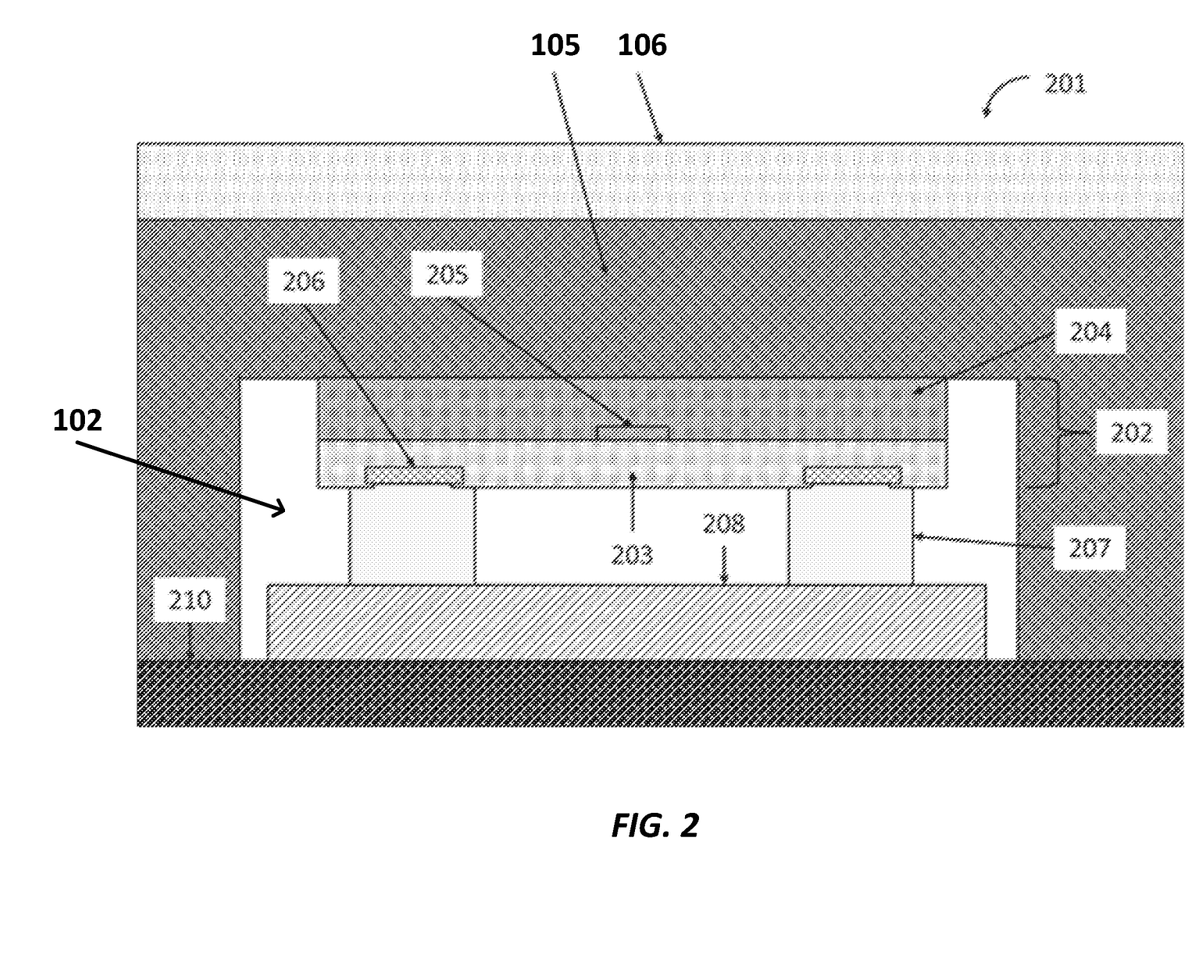
FIG. 2 illustrates a cross sectional view of the force attenuator of FIG. 1 applied to an example chip scale packaged MEMS force sensor including a piezoresistive sensing element.

Referring now to FIG. 2, an example force attenuated force sensor is described. In FIG. 2, the force sensor system 201 (e.g., the force attenuated force sensor) includes a force attenuator (e.g., the force attenuator 101 shown in FIG. 1) and a force sensor 202. The force attenuator includes a deformable slab 105 and a solid non-deformable slab 106. A cavity 102 is provided in the deformable slab 105, and the force sensor 202 is arranged inside the cavity 102. The force attenuator is described in detail above with regard to FIG. 1 and is therefore not described in further detail below with regard to FIG. 2. As described below, the force sensor 202 can include a piezoresistive sensing element.

As described above, the force sensor system 201 can include the force sensor 202. The force sensor system 201 can also include a package substrate 208 such as a printed circuit board (PCB) or a flexible printed circuit board (FPC). The force sensor 202 and the package substrate 208 can be arranged in the cavity 102 of the force attenuator. The force sensor 202 can include a dielectric layer 203, a sensor substrate 204 (e.g., a sensor die), and a piezoresistive sensing element 205. In some implementations, the force sensor 202 can include a plurality of piezoresistive sensing elements 205. This disclosure contemplates that the piezoresistive sensing element(s) 205 can be diffused, deposited, or implanted on a surface of the force sensor 202. The force sensor 202 can also include a metal layer 206 and a solder bump 207. The metal layer 206 and solder bump 207 can be used to electrically and mechanically connect the force sensor 202 to the package substrate 208. Additionally, as shown in FIG. 2, the force attenuator and the package substrate 208 can be mechanically coupled to a solid surface 210 to provide reaction force. An example MEMS force sensor including a piezoresistive sensing element is described in PCT application No. PCT/US2018/056245 to NextInput, Inc., filed Oct. 17, 2018 and entitled "INTEGRATED PIEZORESISTIVE AND PIEZOELECTRIC FUSION FORCE SENSOR," the disclosure of which is incorporated by reference in its entirety.

Figure 3:
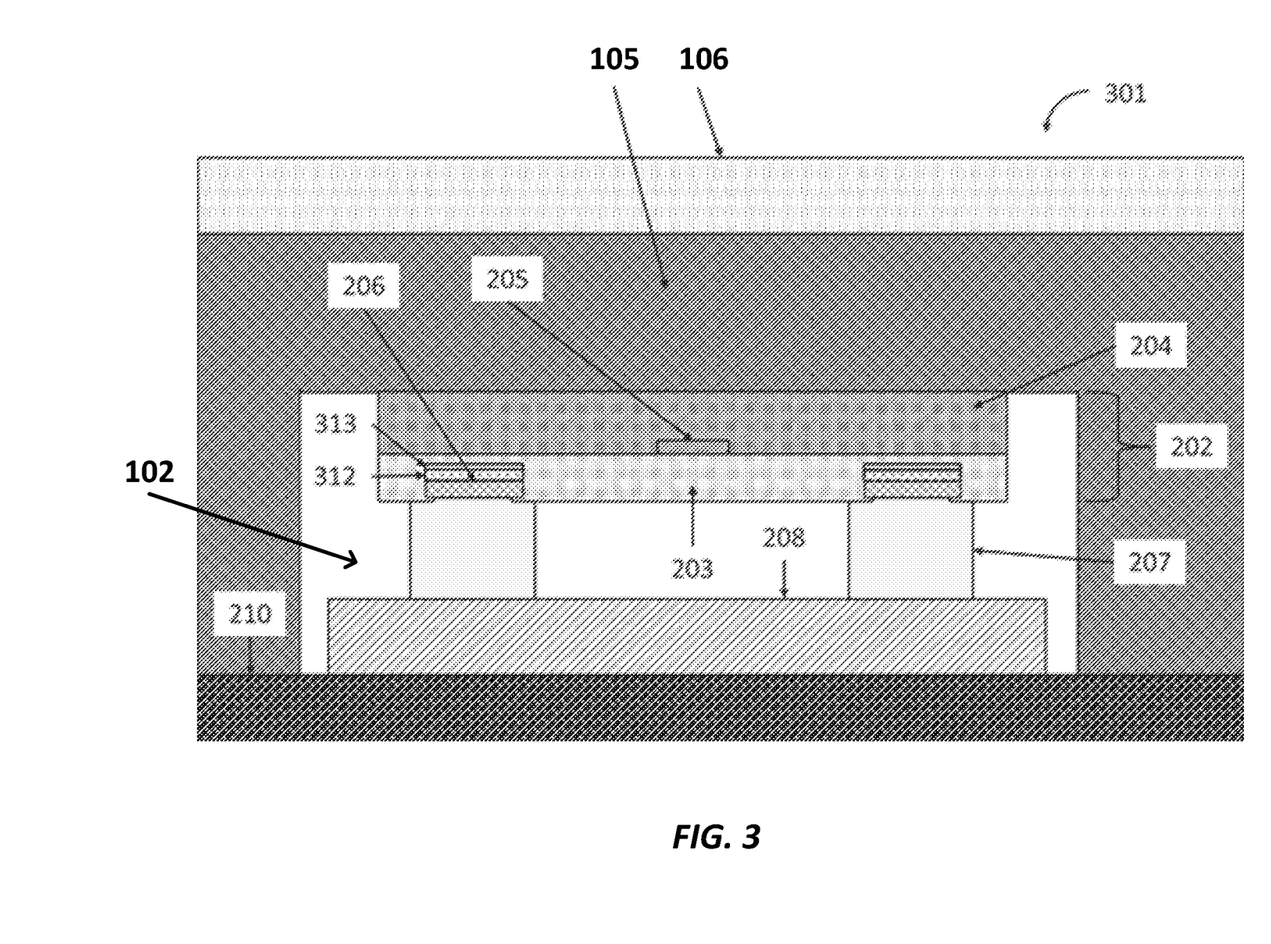
FIG. 3 illustrates a cross sectional view of the force attenuator of FIG. 1 applied to another example chip scale packaged MEMS force sensor including both piezoresistive and piezoelectric sensing elements.

Referring now to FIG. 3, another example force attenuated force sensor is described. In FIG. 3, the force sensor system 301 (e.g., the force attenuated force sensor) includes a force attenuator (e.g., the force attenuator 101 shown in FIG. 1) and a force sensor 202. The force attenuator includes a deformable slab 105 and a solid non-deformable slab 106. A cavity 102 is provided in the deformable slab 105, and the force sensor 202 is arranged inside the cavity 102. The force attenuator is described in detail above with regard to FIG. 1 and is therefore not described in further detail below with regard to FIG. 3. As described below, the force sensor 202 can include both piezoresistive and piezoelectric sensing elements.

As described above, the force sensor system 301 can include the force sensor 202. The force sensor system 301 can also include a package substrate 208 such as a PCB or an FPC. The force sensor 202 and the package substrate 208 can be arranged in the cavity 102 of the force attenuator. The force sensor 202 can include a dielectric layer 203, a sensor substrate 204 (e.g., a sensor die), and a piezoresistive sensing element 205. In some implementations, the force sensor 202 can include a plurality of piezoresistive sensing elements 205. This disclosure contemplates that the piezoresistive sensing element(s) 205 can be diffused, deposited, or implanted on a surface of the force sensor 202. Additionally, the force sensor 202 can include a piezoelectric sensor. A piezoelectric sensor can include a piezoelectric sensing element 312 arranged between opposing electrodes. In FIG. 3, the piezoelectric sensing element 312 is sandwiched between piezoelectric electrode 313 and metal layer 206 (e.g., the opposing electrodes). Piezoresistive and piezoelectric sensing elements can be used together in MEMS force sensors. For example, piezoresistive sensing elements are useful for sensing static forces applied to the force sensor 202, while piezoelectric sensing elements are useful for sensing dynamic forces acting on the force sensor 202. Thus, both piezoresistive and piezoelectric sensors can be used in conjunction to detect both static and dynamic forces. The force sensor 202 can also include a metal layer 206 and a solder bump 207. The metal layer 206 and solder bump 207 can be used to electrically and mechanically connect the force sensor 202 to the package substrate 208. Additionally, as shown in FIG. 3, the force attenuator and the package substrate 208 can be mechanically coupled to a solid surface 210 to provide reaction force. An example MEMS force sensor including both piezoresistive and piezoelectric sensing elements is described in PCT application No. PCT/US2018/056245 to NextInput, Inc., filed Oct. 17, 2018 and entitled "INTEGRATED PIEZORESISTIVE AND PIEZOELECTRIC FUSION FORCE SENSOR," the disclosure of which is incorporated by reference in its entirety.

Figure 4:
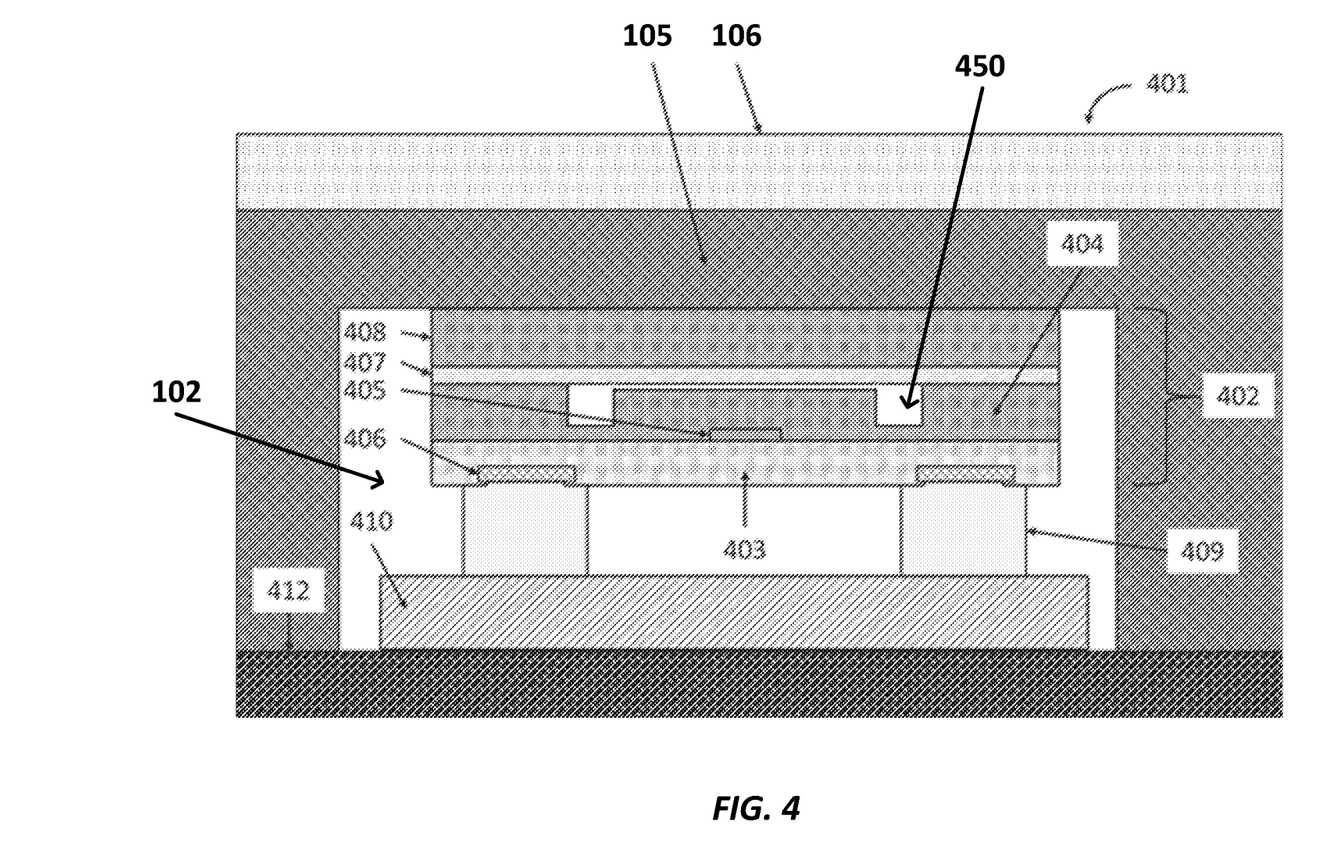
FIG. 4 illustrates a cross sectional view of the force attenuator of FIG. 1 applied to yet another chip scale packaged MEMS force sensor including a sealed cavity and a piezoresistive sensing element.

Referring now to FIG. 4, yet another example force attenuated force sensor is described. In FIG. 4, the force sensor system 401 (e.g., the force attenuated force sensor) includes a force attenuator (e.g., the force attenuator 101 shown in FIG. 1) and a force sensor 402. The force attenuator includes a deformable slab 105 and a solid non-deformable slab 106. A cavity 102 is provided in the deformable slab 105, and the force sensor 402 is arranged inside the cavity 102. The force attenuator is described in detail above with regard to FIG. 1 and is therefore not described in further detail below with regard to FIG. 4. As described below, the force sensor 402 can include a sealed cavity.

As described above, the force sensor system 401 can include the force sensor 402. The force sensor system 401 can also include a package substrate 410 such as a PCB or an FPC. The force sensor 402 and the package substrate 410 can be arranged in the cavity 102 of the force attenuator. The force sensor 402 can include a dielectric layer 403, a sensor substrate 404 (e.g., a sensor die), and a piezoresistive sensing element 405. In some implementations, the force sensor 402 can include a plurality of piezoresistive sensing elements 405. This disclosure contemplates that the piezoresistive sensing element(s) 405 can be diffused, deposited, or implanted on a surface of the force sensor 402. Optionally, in some implementations, the force sensor 402 can include piezoelectric sensing element(s). The force sensor 402 can also include a cap substrate 408, which is attached to the sensor substrate 404 through a bonded oxide layer 407. The internal surfaces between the sensor substrate 404 and the cap substrate 408 form a sealed cavity 450. The sealed cavity 450 can be formed by etching a trench from the sensor substrate 404 and then sealing a volume between the bonded sensor substrate 404 and cap substrate 408. For example, the volume is sealed between the sensor substrate 404 and the cap substrate 408 when adhered together, which results in formation of the sealed cavity 450. The force sensor 202 can also include a metal layer 406 and a solder bump 409. The metal layer 406 and solder bump 409 can be used to electrically and mechanically connect the force sensor 402 to the package substrate 410. Additionally, as shown in FIG. 4, the force attenuator and the package substrate 410 can be mechanically coupled to a solid surface 412 to provide reaction force. An example MEMS force sensor including a sealed cavity is described in U.S. Pat. No. 9,902,611, issued Feb. 27, 2018 and entitled "Miniaturized and ruggedized wafer level mems force sensors;" U.S. Patent Application Publication No. 2016/0363490 to Campbell et al., filed Jun. 10, 2016 and entitled "Ruggedized wafer level mems force sensor with a tolerance trench;" and PCT application No. PCT/US2018/056245 to NextInput, Inc., filed Oct. 17, 2018 and entitled "INTEGRATED PIEZORESISTIVE AND PIEZOELECTRIC FUSION FORCE SENSOR," the disclosures of which are incorporated by reference in their entireties.

Figure 5:
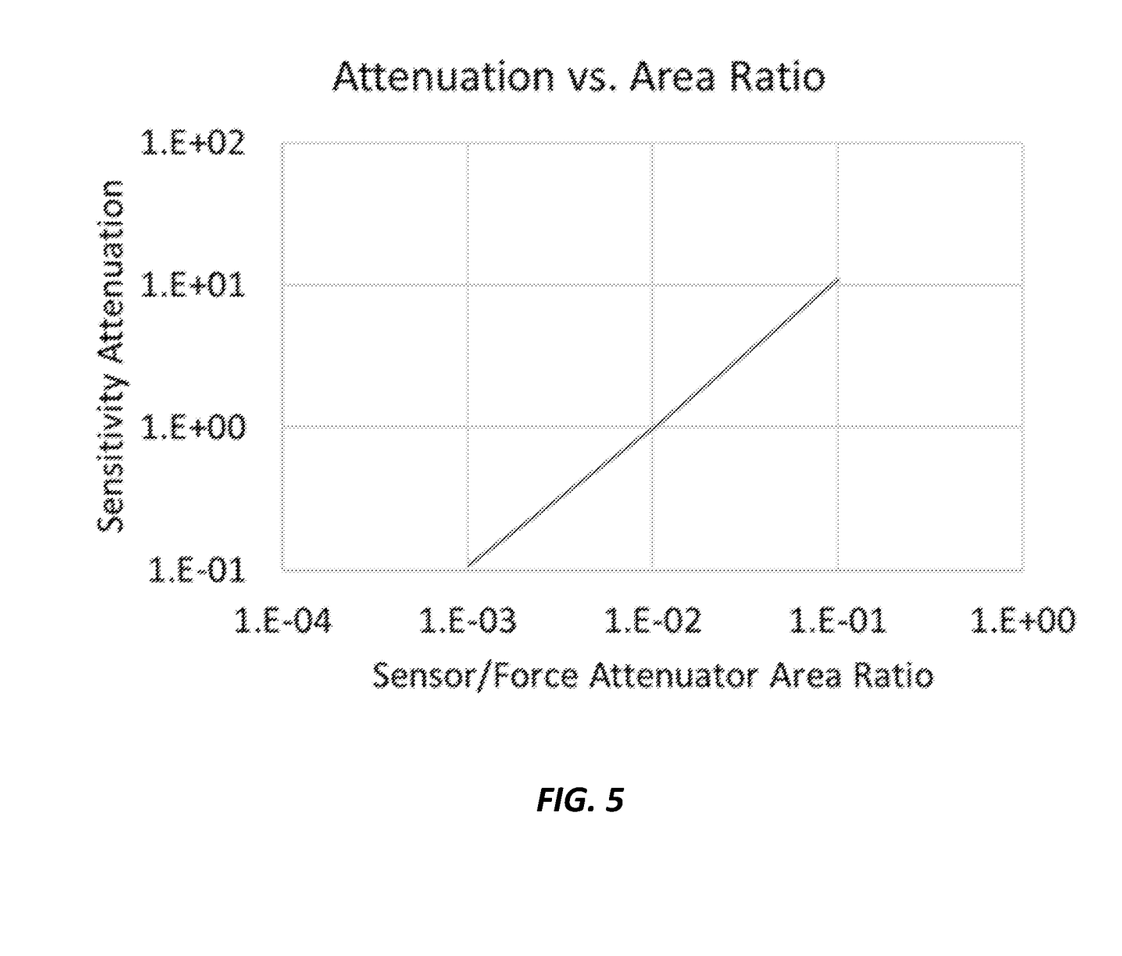
FIG. 5 illustrates the linear relationship between force attenuation and the surface area ratio of the force attenuator to the force sensor.

Referring now to FIG. 5, a graph illustrating the relationship of sensitivity attenuation and the area ratio between the force attenuator and force sensor is described. In FIG. 5, sensitivity attenuation is on the y-axis, and area ratio is on the x-axis. As described herein, the area ratio is the ratio of the respective surface areas of the force-receiving surfaces of the force attenuator and the force sensor. It should be understood from FIG. 5 that the area ratio between the surface area of the top surface of a force attenuator and the surface area of the top surface of a force sensor affects sensitivity attenuation. For example, by changing the area of the top surface of the force attenuator (e.g., top surface 103 of the force attenuator 101 shown in FIG. 1) and keeping the area of the top surface of a sensor (e.g., force sensor 202 or 402 shown in FIGS. 2-4) the same, it is possible to simulate the sensitivity from the force sensor caused by the force applied on the top surface of the attenuator. It is observed from FIG. 5 that from the sensor surface area versus the force attenuator surface area ratio from 1:1000 to 1:10, the relationship between sensitivity attenuation and area ratio is linear. This indicates that the maximum load from the combination of the force attenuator and the force sensor is effectively increased by a factor of 1000 in a linear fashion. This is an efficient solution to increase the maximum load of the force sensor.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A force sensing device comprising:
a force attenuator comprising a deformable slab and a solid-nondeformable slab, wherein:
the force attenuator defines a first surface area for receiving an applied force;
the deformable slab defines a first surface and a second surface, wherein the first surface opposes the second surface;
the non-deformable slab defines a third surface and a fourth surface, wherein the third surface opposes the fourth surface;
the third surface provides the first surface area and the fourth surface of the non-deformable slab is disposed on the first surface of the deformable slab; and
areas of the first surface, the second surface, and the third surface are an identical size and an identical shape such that a relationship between sensitivity attenuation and an area ratio is linear, the areas include the first surface area and the area ratio is a ratio of the areas of the first surface, the second surface, and the third surface;
a cavity formed by the deformable slab such that an opening of the cavity is exposed at the second surface of the deformable slab so that the applied force is transferred to a force sensor within the cavity;
the force sensor provided in the cavity so as to be exposed from the second surface;
a package substrate arranged in the cavity; and
one or more electrical connectors arranged in the cavity and electrically connecting the package substrate to the force sensor, wherein:

the force sensor defines a second surface area for receiving the applied force through the force attenuator;

the force sensor comprises one or more piezoelectric sensing elements, each piezoelectric sensing element comprising a piezoelectric material arranged between a first electrode and a second electrode; and the second electrode of at least one piezoelectric sensing element is arranged over a respective electrical connector and electrically connected to the respective electrical connector.

2. The force sensing device of claim 1, wherein the deformable slab and the force sensor are configured for mounting on a solid surface.

3. The force sensing device of claim 1, wherein the deformable slab is made of a rubber material.

4. The force sensing device of claim 1, wherein the force sensor is a microelectromechanical system (MEMS) force sensor.

5. The force sensing device of claim 4, wherein the MEMS force sensor is a chip scale packaged MEMS force sensor comprising the one or more piezoresistive sensing elements.

6. The force sensing device of claim 1, wherein the force sensor comprises the one or more piezoresistive sensing elements.

7. The force sensing device of claim 1, wherein the force sensor comprises a sealed cavity between a cap substrate of the force sensor and a sensor substrate of the force sensor.

8. The force sensing device of claim 1, wherein:
the sensitivity of the force sensing device increases as the first surface area decreases; or
the sensitivity of the force sensing device decreases as the first surface area increases.

9. The force sensing device of claim 1, wherein the deformable slab defines a cylindrical shape.

10. The force sensing device of claim 1, wherein the first surface, the second surface, the third surface, and the fourth surface are parallel surfaces.

11. A force attenuator comprising:
a deformable slab;
a non-deformable slab, wherein:
the deformable slab defines a first surface and a second surface, wherein the first surface opposes the second surface;
the non-deformable slab defines a third surface and a fourth surface, wherein the third surface opposes the fourth surface;
the third surface provides a first surface area and the fourth surface of the non-deformable slab is disposed on the first surface of the deformable slab; and
the third surface defines the first surface area for receiving an applied force;
areas of the first surface, the second surface, and the third surface, are an identical size and an identical shape such that a relationship between sensitivity attenuation and an area ratio is linear, the areas include the first surface area and the area ratio is a ratio of the areas of the first surface, the second surface, and the third surface;
a cavity formed by the deformable slab such that an opening of the cavity is exposed at the second surface of the deformable slab so that the applied force is transferred to a force sensor within the cavity;
the force sensor provided in the cavity so as to be exposed from the second surface, wherein the force sensor comprises one or more piezoresistive sensing elements and one or more piezoelectric sensing elements, each piezoelectric sensing element comprising piezoelectric material between a first electrode and a second electrode;
a package substrate; and
one or more electrical connectors, wherein:
the force sensor is disposed on a surface of the cavity;
the package substrate is disposed opposite the force sensor in the cavity;
the one or more electrical connectors are disposed in the cavity and electrically connect the package substrate to the force sensor; and
the second electrode of at least one piezoelectric sensing element is disposed over a respective electrical connector and electrically connected to the respective electrical connector.

12. The force attenuator of claim 11, wherein the force sensor is a microelectromechanical system (MEMS) force sensor.

13. The force attenuator of claim 11, wherein the deformable slab is made of a rubber material.

14. The force attenuator of claim 11, wherein two opposing surfaces of the deformable slab are parallel surfaces.

* * * * *

UNITED STATES PATENT AND TRADEMARK OFFICE
CERTIFICATE OF CORRECTION

PATENT NO. : 11,874,185 B2
APPLICATION NO. : 16/764992
DATED : January 16, 2024
INVENTOR(S) : Julius Minglin Tsai and Dan Benjamin It is certified that error appears in the above-identified patent and that said Letters Patent is hereby corrected as shown below:

In the Specification

In Column 4, Line 22, replace "1056" with --105B--.

Signed and Sealed this
Twentieth Day of February, 2024

Katherine Kelly Vidal
Director of the United States Patent and Trademark Office